United States Patent
Sakai et al.

(10) Patent No.: US 6,838,016 B2
(45) Date of Patent: Jan. 4, 2005

(54) POLISHING COMPOSITION AND POLISHING METHOD EMPLOYING IT

(75) Inventors: Kenji Sakai, Nishikasugai-gun (JP); Hiroshi Asano, Nishikasugai-gun (JP); Tadahiro Kitamura, Nishikasugai-gun (JP); Koji Ohno, Nishikasugai-gun (JP); Katsuyoshi Ina, Nishikasugai-gun (JP)

(73) Assignee: Fujimi Incorporated, Nishikasugai-gun (JP)

( * ) Notice: Subject to any disclaimer, the term of this patent is extended or adjusted under 35 U.S.C. 154(b) by 283 days.

(21) Appl. No.: 09/985,490

(22) Filed: Nov. 5, 2001

(65) Prior Publication Data

US 2002/0096659 A1 Jul. 25, 2002

(30) Foreign Application Priority Data

Nov. 24, 2000 (JP) ........................................ 2000-357249

(51) Int. Cl.$^7$ ........................ C09K 13/00; C09K 13/06; H01L 21/302
(52) U.S. Cl. ..................... 252/79.1; 252/79.4; 438/692
(58) Field of Search ........................... 252/79.1; 438/692

(56) References Cited

U.S. PATENT DOCUMENTS

| | | | |
|---|---|---|---|
| 5,575,885 A | 11/1996 | Hirabayasi et al. | 438/14 |
| 5,770,095 A | 6/1998 | Sasaki et al. | 216/38 |
| 5,876,490 A | 3/1999 | Ronay | 106/3 |
| 5,954,997 A | 9/1999 | Kaufman et al. | 252/79.1 |
| 6,126,853 A | 10/2000 | Kaufman et al. | 252/79.1 |
| 6,312,321 B1 * | 11/2001 | Fukushima et al. | 451/285 |
| 6,440,186 B1 * | 8/2002 | Sakai et al. | 51/308 |
| 6,444,139 B1 * | 9/2002 | Minamihaba et al. | 216/89 |
| 6,552,434 B2 * | 4/2003 | Hasunuma et al. | 257/765 |

FOREIGN PATENT DOCUMENTS

| | | | |
|---|---|---|---|
| EP | 0 747 939 | 12/1996 | |
| EP | 0 846 742 | 6/1998 | |
| EP | 1 011 131 | 6/2000 | |
| EP | 1 020 488 | 7/2000 | |
| EP | 1167482 A2 * | 1/2002 | C09G/1/02 |

* cited by examiner

*Primary Examiner*—Robert Kunemund
*Assistant Examiner*—Lynette T. Umez-Eronini
(74) *Attorney, Agent, or Firm*—Oblon, Spivak, McClelland, Maier & Neustadt, P.C.

(57) ABSTRACT

A polishing composition comprising the following components (a) to (g):

Figure 1A:
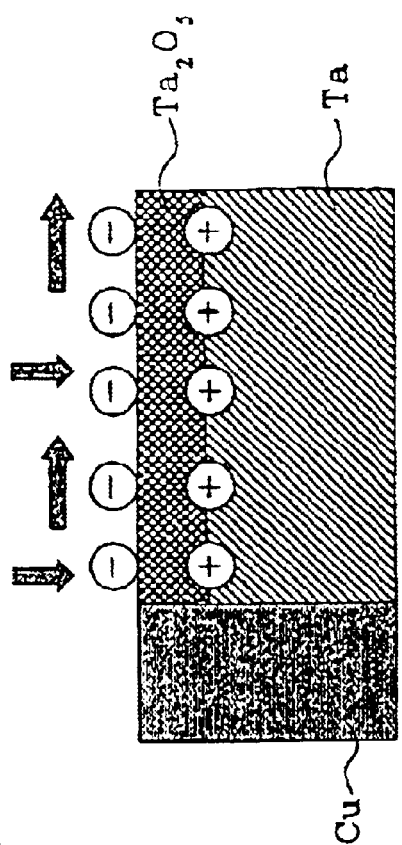
Figure 1B:
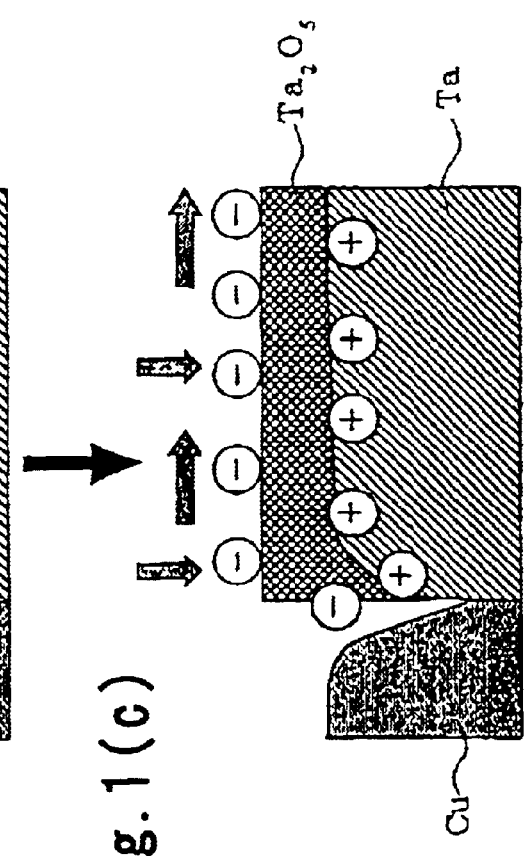
Figure 1C:
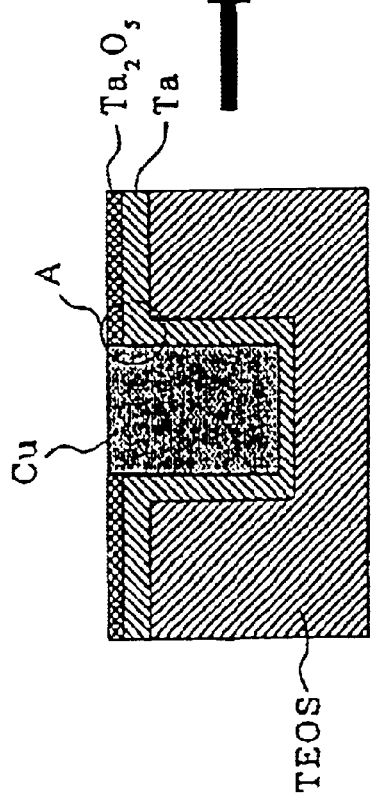
Figure 1D:
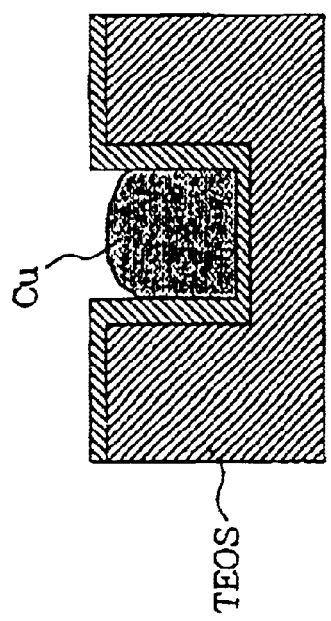

(a) an abrasive which is at least one member selected from the group consisting of silicon dioxide, aluminum oxide, cerium oxide, zirconium oxide and titanium oxide,
(b) a polyalkyleneimine,
(c) at least one member selected from the group consisting of guinaldic acid and its derivatives,
(d) at least one member selected from the group consisting of glycine, α-alanine, histidine and their derivatives,
(e) at least one member selected from the group consisting of benzotriazole and its derivatives,
(f) hydrogen peroxide, and
(g) water.

17 Claims, 1 Drawing Sheet

POLISHING COMPOSITION AND POLISHING METHOD EMPLOYING IT

The present invention relates to a polishing composition to be used for polishing substrates for semiconductors, photomasks and various memory hard disks, particularly to a polishing composition useful for polishing for planarization of the surface of device wafers in e.g. semiconductor industry, and a polishing method employing such a composition.

More particularly, the present invention relates to a polishing composition which is highly efficient, provides high selectivity and is applicable to formation of excellent polished surface in the polishing of semiconductor devices to which so-called chemical mechanical polishing (hereinafter referred to as "CMP") technology is applied, in the processing of device wafers, and a polishing method employing such a composition.

Progress of so-called high technology products including computers has been remarkable in recent years, and parts to be used for such products, such as ULSI devices, have been developed for high integration and high speed, year after year. Along with such progress, the design rule for semiconductor devices has been progressively refined year after year, the depth of focus in a process for producing devices tends to be shallow, and planarization required for the pattern-forming surface tends to be increasingly severe.

Further, to cope with an increase in resistance of the wiring due to refinement of the wiring, it has been studied to employ copper instead of tungsten or aluminum, as the wiring material. By its nature, copper is hardly processable by etching, and accordingly, it requires the following process.

Namely, after forming wiring grooves and vias on an insulating layer, copper wirings are formed by sputtering or plating (so-called damascene method), and then an unnecessary copper layer deposited on the insulating layer is removed by CMP process which is a combination of mechanical polishing and chemical polishing.

However, in such a process, it may happen that copper atoms will diffuse into the insulating layer to deteriorate the device properties. Therefore, for the purpose of preventing diffusion of copper atoms, it has been studied to provide a barrier layer on the insulating layer having wiring grooves or vias formed. As a material for such a barrier layer, metal tantalum or a tantalum compound such as tantalum nitride (hereinafter will generally be referred to as a tantalum-containing compound) is most suitable also from the viewpoint of the reliability of the device and is expected to be employed mostly in the future.

Accordingly, in such a CMP process for a semiconductor device containing such a copper layer and a tantalum-containing compound layer, firstly the copper layer as the outermost layer and then the tantalum-containing compound layer as the barrier layer, are polished, respectively, and polishing will be completed when it has reached the insulating layer of e.g. silicon dioxide or monofluoro silicon oxide (SiOF). As an ideal process, it is desired that by using only one type of a polishing composition, the copper layer and the tantalum-containing compound layer are uniformly removed by polishing in a single polishing step, and polishing will be completed certainly when it has reached the insulating layer.

However, copper and a tantalum-containing compound are different in their hardness, chemical stability and other mechanical properties and accordingly in the processability, and thus, it is difficult to adopt such an ideal polishing process. Accordingly, the following two step polishing process, i.e. polishing process divided into two steps, is being studied.

Firstly, in the first step polishing (hereinafter referred to as the first polishing), using a polishing composition capable of polishing a copper layer at a high efficiency, the copper layer is polished using e.g. a tantalum-containing compound layer as a stopper until such a tantalum-containing compound layer is reached. Here, for the purpose of not forming various surface damages such as recesses, erosion, dishing, etc., on the copper layer surface, polishing may be terminated immediately before reaching the tantalum-containing compound layer i.e. while a copper layer still slightly remains. Then, in the second step polishing (hereinafter referred to as the second polishing), using a polishing composition capable of polishing mainly a tantalum-containing compound layer at a high efficiency, the remaining thin copper layer and the tantalum-containing compound layer are polished using the insulating layer as a stopper, and polishing is completed when it has reached the insulating layer.

Here, dishing, recesses and erosion are excessive polishing, caused by difference in hardness between a wiring layer (copper in this case) and the insulating layer or the tantalum-containing compound layer, by etching effect to the wiring layer, and mainly by a difference in pressure applied per unit area, respectively, and they decrease the cross-sectional area of the wiring layer. Accordingly, when a device is prepared, they tend to increase the resistance of the wiring at the corresponding portion, or they may cause contact failure in extreme cases. Accordingly, the polishing composition to be used in the first polishing is required to have a property such that it is capable of polishing the copper layer at a high stock removal rate without forming the above-mentioned various surface defects on the copper layer surface, which can not be removed by the second polishing.

With respect to such a polishing composition for a copper layer, for example, JP-A-7-233485 discloses a polishing liquid for a copper type metal layer, which comprises at least one organic acid selected from the group consisting of aminoacetic acid (hereinafter referred to as glycine) and amidesulfuric acid, an oxidizing agent and water, and a method for producing a semiconductor device using such a polishing liquid. If this polishing liquid is used for polishing a copper layer, a relatively high stock removal rate is obtainable. It is believed that copper atoms on the copper layer surface be oxidized by the action of the oxidizing agent, and the oxidized copper elements are taken into a chelate compound, whereby a high stock removal rate can be obtained.

However, as a result of the experiments conducted by the present inventors, it has been confirmed that when a copper layer having a pattern formed thereon is polished by using a polishing composition comprising only an abrasive, glycine and hydrogen peroxide, erosion tends to be significant at a high density copper wiring portion, and the wiring resistance at the corresponding portion on a prepared device may be impaired. This phenomenon is remarkable particularly at a high density wiring portion having a copper wiring density of at least 90%. This is considered to be a problem caused because the tantalum-containing compound in the first polishing can not adequately act as a stopper. Namely, it has been strongly desired to develop a polishing composition which can make the tantalum-containing compound effectively act as a stopper in the first polishing and with which polishing can be carried out without increasing the erosion at a high density copper wiring portion.

The present invention has been made to solve the above-described problems. Namely, it is an object of the present invention to provide a polishing composition and a polishing method, whereby formation of erosion at a high density copper wiring portion is suppressed as far as possible, in polishing of a wafer having a device pattern containing at least a layer of copper and a layer of a tantalum-containing compound formed on a substrate.

The present invention provides a polishing composition comprising the following components (a) an abrasive which is at least one member selected from the group consisting of silicon dioxide, aluminum oxide, cerium oxide, zirconium oxide and titanium oxide, (b) a polyalkyleneimine, (c) at least one member selected from the group consisting of quinaldic acid and its derivatives, (d) at least one member selected from the group consisting of glycine, α-alanine, histidine and their derivatives, (e) at least one member selected from the group consisting of benzotriazole and its derivatives, (f) hydrogen peroxide, and (g) water.

Further, the present invention provides a polishing method for polishing a semiconductor device having at least a layer of copper and a layer of a tantalum-containing compound formed on a substrate, by means of a polishing composition comprising the above components (a) to (g).

Now, the present invention will be described in detail with reference to the preferred embodiment.

In the present invention, as the polyalkyleneimine, polyethyleneimine, polypropyleneimine or polybutadieneimine may, for example, be typically mentioned, and it usually means a compound having a nitrogen atom incorporated in a saturated hydrocarbon and present in a state of a polymer.

Further, it includes copolymers of such examples. Further, it includes linear ones, ones having side chains and ones having a cyclic structure.

Specific structural formulae of the polyalkyleneimine include (—CH$_2$CH$_2$NH—)n, (—CH$_2$CH$_2$CH$_2$NH—)n, (—CH$_2$CH$_2$CH$_2$CH$_2$NH—)n, (—CH$_2$CH$_2$N(CH$_2$NH$_2$)CH$_2$CH$_2$NH—)n, (—CH$_2$CH$_2$N(CH$_2$CH$_2$NH$_2$)CH$_2$CH$_2$NH—)n, (—CH$_2$CH$_2$N(CH$_2$CH$_2$CH$_2$NH$_2$)CH$_2$CH$_2$NH—)n, (—CH$_2$CH$_2$CH$_2$N(CH$_2$NH$_2$)CH$_2$CH$_2$CH$_2$NH—)n, (—CH$_2$CH$_2$CH$_2$N(CH$_2$CH$_2$NH$_2$)CH$_2$CH$_2$CH$_2$NH—)n, and (—CH$_2$CH$_2$CH$_2$N)(CH$_2$CH$_2$CH$_2$NH$_2$)CH$_2$CH$_2$CH$_2$NH—)n, but it is not limited thereto.

Among such polyalkyleneimines, preferred is a polyethyleneimine, and its structural formula is (—CH$_2$CH$_2$NH—)n. With respect to the molecular weight, preferred is one which generates less odor when incorporated in the polishing composition, and which can easily be dissolved, and from such a viewpoint, preferred molecular weight is within a range of from 200 to 1,000,000.

The content of the polyalkyleneimine is usually within a range of from 0.05 to 3 g/l, preferably from 0.1 to 1 g/l, based on the polishing composition. If the content of the polyalkyleneimine is less than 0.05 g/l, the effect of the tantalum-containing compound as a stopper tends to be small, and as a result, there is a possibility that the erosion can not adequately be suppressed. On the other hand, if the content of the polyalkyleneimine exceeds 3 g/l, the abrasive in the polishing composition tends to aggregate, thus causing polishing scratches (scratches), and due care will accordingly be required. Further, there is such a problem that pH tends to be extremely high.

The polishing composition of the present invention contains at least one member selected from the group consisting of quinaldic acid and its derivatives. Quinaldic acid forms a chelate with copper ions, and as mentioned above, it has an effect to suppress excessive erosion and etching on the copper layer surface during polishing. Accordingly, it becomes possible to suppress formation of erosion even at a high density copper wiring portion. The following chemical formula is the molecular formula of quinaldic acid.

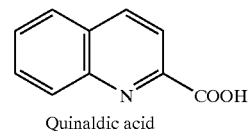

Quinaldic acid

The content of quinaldic acid in the polishing composition is usually within a range of from 0.0003 to 0.005 mol/l, preferably from 0.0006 to 0.0012 mol/l. If the content of quinaldic acid is less than 0.0003 mol/l, surface roughening on the copper layer may not adequately be suppressed, and if it exceeds 0.005 mol/l, quinaldic acid itself is less likely to be dissolved, and it may be deposited in some cases.

As derivatives of quinaldic acid, a structure having an insoluble functional group such as a methyl group or an ethyl group bonded to each site may be mentioned. However, e.g. an amino group and a hydroxyl group may increase solubility of the quinaldic acid derivative itself and may inhibit the effect to suppress erosion and etching on the copper layer.

The polishing composition of the present invention contains, in addition to quinaldic acid, at least one member selected from the group consisting of glycine, α-alanine, histidine and their derivatives. Further, its content in the polishing composition is preferably from 0.04 to 0.2 mol/l, more preferably from 0.06 to 0.12 mol/l. If the content is less than 0.04 mol/l, the stock removal rate of the copper layer tends to be small. On the other hand, if it exceeds 0.2 mol/l, the stock removal rate of the copper layer tends to be too high, and control of polishing tends to be difficult, and due care will be required when the polishing composition is used.

Usually as an abrasive, it has been known to use fine particles of e.g. an oxide, an nitride or a carbide of a metal. Particularly, e.g. aluminum oxide, silicon dioxide, cerium oxide, zirconium oxide or titanium oxide may, for example, be used for the polishing composition of the present invention. Among them, preferred is silicon dioxide, particularly preferred is colloidal silica.

The content of the abrasive in the polishing composition of the present invention is usually from 5 to 50 g/l, preferably from 10 to 30 g/l, more preferably from 15 to 25 g/l. If the content of the abrasive is too low, the mechanical polishing power tends to decrease, whereby the stock removal rate of the copper layer may decrease. On the other hand, if the content of the abrasive is too high, the mechanical polishing power tends to increase, and the rate of polishing the tantalum-containing compound layer tends to be too high, and erosion tends to increase.

In the present invention, the role of a compound which has an effect to form a protective layer for the copper layer, is to protect the copper layer during and after the polishing, and as a result, to suppress recesses and dishing at the copper wiring portion and to suppress erosion of copper. A compound which has such a role and is used in the present invention is a derivative of benzotriazole, and it may, for example, be benzimidazole, triazole, imidazole or tolyltriazole.

Further, its content in the polishing composition is preferably from 0.0002 to 0.002 mol/l, more preferably from 0.0003 to 0.001 mol/l. If the content is less than 0.0002 mol/l, copper layer surface tends to be eroded after the polishing. On the other hand, if it exceeds 0.002 mol/l, the effect to form a protective layer for copper tends to be significant, and accordingly the polishing tends to be non-uniform, or the stock removal rate of copper tends to be excessively decreased, such being unfavorable.

The polishing composition of the present invention contains hydrogen peroxide. In the polishing composition of the present invention, hydrogen peroxide is believed to act as an oxidizing agent. Here, hydrogen peroxide has a characteristic such that one having a sufficient oxidizing power to oxidize the copper layer and containing no metal ion as an impurity, can readily be available, and thus it is particularly suitable for the polishing composition of the present invention.

The content of hydrogen peroxide in the polishing composition of the present invention is preferably from 0.03 to 1 mol/l, more preferably from 0.1 to 0.5 mol/l. If the content of hydrogen peroxide is too low or too high, the stock removal rate of the copper layer tends to be low, and due care will accordingly be required.

Further, the medium of the polishing composition of the present invention is water. Water is preferably one having impurities reduced as far as possible, so that the above-mentioned respective components can precisely perform their roles.

Namely, water is preferably distilled water, or one having impurity ions removed by an ion exchange resin and having suspended matters removed by a filter.

Accordingly, the polishing composition of the present invention is prepared usually by dissolving or dispersing the above-described respective components, i.e. (a) the abrasive which is at least one member selected from the group consisting of silicon dioxide, aluminum oxide, cerium oxide, zirconium oxide and titanium oxide, (b) the polyalkyleneimine, (c) at least one member selected from the group consisting of quinaldic acid and its derivatives, (d) at least one member selected from the group consisting of glycine, α-alanine, histidine and their derivatives, (e) at least one member selected from the group consisting of benzotriazole and its derivatives, and (f) hydrogen peroxide, in (g) water.

Here, methods and order for dissolving or dispersing are optional. For example, stirring by a vane-type stirrer or supersonic dispersion may be employed. By such a method, soluble components will be dissolved and insoluble components will be dispersed, whereby the composition will be a uniform dispersion. The polishing composition of the present invention may further contain a pH-adjusting agent to adjust the pH, various surfactants and other additives.

In the present invention, the pH-adjusting agent is used to improve the stability of the polishing composition, to improve the safety in use or to meet the requirements of various regulations. As a pH-adjusting agent employed to lower the pH of the polishing composition of the present invention, hydrochloric acid, nitric acid, sulfuric acid, chloroacetic acid, tartaric acid, succinic acid, citric acid, malic acid, malonic acid, various fatty acids, various polycarboxylic acids, etc., may be mentioned. On the other hand, one to be used for the purpose of increasing the pH, potassium hydroxide, sodium hydroxide, ammonia, ethylenediamine, piperazine, etc., may be mentioned. The polishing composition of the present invention is not particularly limited with respect to the pH, but it is usually adjusted to pH 3 to 10.

In the polishing composition of the present invention, the surfactant is used to increase the dispensability of the abrasive or to adjust the viscosity or the surface tension of the polishing composition. The surfactants include, for example, a dispersing agent, a wetting agent, a thickener, a defoaming agent, a foaming agent, a water repellent, etc. The surfactant to be used as a dispersing agent, may usually be of a sulfonic acid type, a phosphoric acid type, a carboxylic acid type or a nonionic type.

The polishing composition of the present invention may be prepared, stored or transported in the form of a stock solution having a relatively high concentration, so that it may be diluted for use at the time of actual polishing operation. The above-mentioned preferred range for the concentration is one for the actual polishing operation. Needless to say, in the case of adopting such a method of use, the stock solution during the storage or transportation is a solution having a higher concentration.

Further, hydrogen peroxide has a characteristic such that it decomposes in the presence of e.g. metal ions, ammonium ions or an amine. Accordingly, in the polishing composition of the present invention, it is advisable to add and mix it to the polishing composition immediately prior to the actual use for polishing operation. Such decomposition of hydrogen peroxide can be suppressed by incorporating a carboxylic acid or an alcohol. Namely, it is possible to obtain such an effect by the above-mentioned pH-adjusting agent. However, such decomposition will be influenced also by the storage environment, and there is a possibility that part of hydrogen peroxide undergoes decomposition due to a temperature change during transportation or due to formation of a stress. Accordingly, it is preferred to carry out the mixing of hydrogen peroxide immediately before polishing.

The most important point in the present invention is that the formation of erosion is suppressed as far as possible by incorporating a polyalkyleneimine into the polishing composition. The mechanism of this effect is estimated as follows. Namely, the surface of the tantalum-containing compound is negatively charged during polishing. The polyalkyleneimine which is positively charged is adsorbed on the surface and protects the surface of the tantalum-containing compound, whereby substantially no tantalum-containing compound is polished and removed. Accordingly, the tantalum-containing compound completely acts as a stopper in the first polishing, and as a result, suppresses the formation of the erosion.

In the present invention, the second most important point is that the polishing composition contains at least one member selected from the group consisting of quinaldic acid and its derivatives, so as to make good use of the effect. Namely, in a case where the polishing composition contains a polyalkyleneimine alone, erosion or etching effect to the copper surface tends to be significant, and as a result, copper surface after polishing may be in a roughened state.

In order to prevent the roughening on the surface, quinaldic acid or its derivatives are most effective. Quinaldic acid or its derivatives are believed to be substances which react with copper ions moderately even among compounds which form a chelate with copper ions, and which are suitable for suppressing excessive erosion or etching effect to copper.

In the polishing composition of the present invention, roles of the components other than the above-described substances on the polishing of copper are estimated below. Firstly, the abrasive serves to perform so-called mechanical polishing and accelerates polishing. Hydrogen peroxide oxidizes the copper surface to form a brittle oxidized layer.

Further, the at least one member selected from the group consisting of glycine, α-alanine, histidine and their derivatives, affects the oxidized copper surface to form a chelate with copper ions. Here, polishing of the copper proceeds by a combined effect of the mechanical effect of the abrasive and the chemical effect of hydrogen peroxide and the at least one member selected from the group consisting of glycine, α-alanine, histidine and their derivatives. Further, the at least one member selected from the group consisting of benzotriazole and its derivatives suppresses excessive polishing of copper and suppresses erosion of copper after polishing.

Now, the present invention will be described in detail with reference to Examples. However, it should be understood that the present invention is by no means restricted to such specific Examples.

EXAMPLES 1 to 43

Preparation of Polishing Compositions

Polishing compositions were prepared to have compositions as identified in Tables 1 and 2. Namely, in Examples 1 to 9, polyethyleneimine has the polyalkyleneimine in an amount of 0.5 g/l, quinaldic acid as a compound which forms a chelate with copper ions in an amount of 0.0009 mol/l, glycine in an amount of 0.09 mol/l, and further, benzotriazole in an amount of 0.0005 mol/l and hydrogen peroxide in an amount of 0.3 mol/l as constant amounts were used, and the amount of colloidal silica as the abrasive alone was changed from 3 to 80 g/l. As the hydrogen peroxide, a commercially available 31% aqueous solution was employed, and it was mixed immediately before polishing.

Further, in Examples 10 to 15, the amount of the polyalkyleneimine alone was changed within a range of from 0.03 to 5 g/l, and the amount of colloidal silica was constant at 20 g/l (the other components were the same as in Examples 1 to 9). Similarly, in Examples 16 to 21, the amount of quinaldic acid alone was changed within a range of from 0.0002 to 0.005 mol/l. The other components and their amounts were constant.

In Examples 22 to 27, the amount of glycine as a compound which forms a chelate with copper ions alone was changed within a range of from 0.02 to 0.3 mol/l, and in Examples 28 to 33, the amount of benzotriazole alone was changed within a range of from 0.0001 to 0.003 mol/l, and in Examples 34 to 39, the amount of hydrogen peroxide alone was changed within a range of from 0.02 to 2 mol/l.

Further, Examples 40 to 43 are to compare processability in a case where the type of the polyalkyleneimine was changed. The amount was constant at 0.5 g/l in each Example, and the type was changed to polypropyleneimine (average molecular weight: 50,000), polybutadieneimine (average molecular weight: 50,000) or polyethyleneimine (average molecular weight: 70,000). Here, in the case of polyethyleneimine, α-alanine or histidine was employed instead of glycine as a compound which forms a chelate with copper ions to compare performances.

Polishing Tests

Polishing was carried out by means of a one side polishing machine for CMP (AVANTI472, manufactured by Speed Fam-IPEC, Inc.). To the table of the polishing machine, a laminated polishing pad made of polyurethane (IC-1000/Suba400, manufactured by Rodel Inc., U.S.A.) was bonded. The polishing conditions were such that the polishing pressure was 4 psi, the table rotational speed was 70 rpm, the feed rate of the polishing composition was 250 cc/min, and the rotational speed of the carrier was 70 rpm.

As objects to be polished, a blanket wafer having a copper layer formed by electrolytic plating, and a patterned wafer having a design having a copper wiring density of 90%, were used. Polishing of the blanket wafer was carried out for one minute, and the stock removal rate was calculated from the layer thickness before and after the polishing.

With respect to the end point of the polishing of patterned wafer, the end point was detected from the torque current of the carrier, and overpolishing of 10% by time was carried out and then the polishing was completed. After the polishing, the wafers were sequentially washed and dried, whereupon erosion at the 90% density portion was measured by means of a profiler (p2, manufactured by KLA-Tencor).

Further, the surface roughening and erosion state on the copper surface were observed by an optical microscope and evaluated in accordance with the following standards.

⊚: No surface roughening nor erosion observed at all.

○: Slight surface roughening and erosion observed, but no problem in property.

Δ: Surface roughening and erosion observed over the entire surface.

X: Surface roughening or erosion is too severe for practical use.

The obtained results are shown in Tables 1 and 2 together with the compositions of the polishing compositions.

TABLE 1

| Ex. | Abrasive colloidal silica (g/l) | Polyalkyleneimine Type | Polyalkyleneimine g/l | Compound which forms a chelate with copper ions Type | Compound which forms a chelate with copper ions mol/l | Type | mol/l | Benzotriazole mol/l | Hydrogen peroxide mol/l | Stock removal rate of copper A/min | Erosion A | Copper surface state |
|---|---|---|---|---|---|---|---|---|---|---|---|---|
| 1 | 3 | PEI | 0.5 | Q | 0.0009 | G | 0.09 | 0.0005 | 0.3 | 2000 | 10 | ⊚ |
| 2 | 5 | PEI | 0.5 | Q | 0.0009 | G | 0.09 | 0.0005 | 0.3 | 3100 | 10 | ⊚ |
| 3 | 10 | PEI | 0.5 | Q | 0.0009 | G | 0.09 | 0.0005 | 0.3 | 4300 | 10 | ⊚ |
| 4 | 15 | PEI | 0.5 | Q | 0.0009 | G | 0.09 | 0.0005 | 0.3 | 4800 | 10 | ⊚ |
| 5 | 20 | PEI | 0.5 | Q | 0.0009 | G | 0.09 | 0.0005 | 0.3 | 5300 | 10 | ⊚ |
| 6 | 25 | PEI | 0.5 | Q | 0.0009 | G | 0.09 | 0.0005 | 0.3 | 5500 | 10 | ⊚ |
| 7 | 30 | PEI | 0.5 | Q | 0.0009 | G | 0.09 | 0.0005 | 0.3 | 5800 | 10 | ⊚ |
| 8 | 50 | PEI | 0.5 | Q | 0.0009 | G | 0.09 | 0.0005 | 0.3 | 6300 | 10 | ⊚ |
| 9 | 80 | PEI | 0.5 | Q | 0.0009 | G | 0.09 | 0.0005 | 0.3 | 6800 | 10 | ⊚ |
| 10 | 20 | PEI | 0.03 | Q | 0.0009 | G | 0.09 | 0.0005 | 0.3 | 4500 | 400 | ⊚ |
| 11 | 20 | PEI | 0.05 | Q | 0.0009 | G | 0.09 | 0.0005 | 0.3 | 4800 | 200 | ⊚ |
| 12 | 20 | PEI | 0.1 | Q | 0.0009 | G | 0.09 | 0.0005 | 0.3 | 5100 | 10 | ⊚ |
| 13 | 20 | PEI | 1.0 | Q | 0.0009 | G | 0.09 | 0.0005 | 0.3 | 5700 | 10 | ⊚ |
| 14 | 20 | PEI | 3.0 | Q | 0.0009 | G | 0.09 | 0.0005 | 0.3 | 6200 | 10 | ⊚ |
| 15 | 20 | PEI | 5.0 | Q | 0.0009 | G | 0.09 | 0.0005 | 0.3 | 6600 | 10 | ⊚ |

TABLE 1-continued

| Ex. | Abrasive colloidal silica (g/l) | Polyalkyl-eneimine Type | g/l | Compound which forms a chelate with copper ions Type | mol/l | Type | mol/l | Benzo-triazole mol/l | Hydrogen peroxide mol/l | Stock removal rate of copper A/min | Erosion A | Copper surface state |
|---|---|---|---|---|---|---|---|---|---|---|---|---|
| 16 | 20 | PEI | 0.5 | Q | 0.0002 | G | 0.09 | 0.0005 | 0.3 | 6900 | 10 | Δ |
| 17 | 20 | PEI | 0.5 | Q | 0.0003 | G | 0.09 | 0.0005 | 0.3 | 6500 | 10 | ○ |
| 18 | 20 | PEI | 0.5 | Q | 0.0006 | G | 0.09 | 0.0005 | 0.3 | 5900 | 10 | ◎ |
| 19 | 20 | PEI | 0.5 | Q | 0.0012 | G | 0.09 | 0.0005 | 0.3 | 5400 | 10 | ◎ |
| 20 | 20 | PEI | 0.5 | Q | 0.005 | G | 0.09 | 0.0005 | 0.3 | 3800 | 100 | ◎ |
| 21 | 20 | PEI | 0.5 | Q | 0.01 | G | 0.09 | 0.0005 | 0.3 | 2000 | 300 | ◎ |

Q: Quinaldic acid, G: Glycine: PEI: Polyethyleneimine (Average molecular weight: 70,000)

TABLE 2

| Ex. | Abrasive colloidal silica (g/l) | Polyalkyl-eneimine Type | g/l | Compound which forms a chelate with copper ions Type | mol/l | Type | mol/l | Benzo-triazole mol/l | Hydrogen peroxide mol/l | Stock removal rate of copper A/min | Erosion A | Copper surface state |
|---|---|---|---|---|---|---|---|---|---|---|---|---|
| 22 | 20 | PEI | 0.5 | Q | 0.0009 | G | 0.02 | 0.0005 | 0.3 | 2500 | 10 | ◎ |
| 23 | 20 | PEI | 0.5 | Q | 0.0009 | G | 0.04 | 0.0005 | 0.3 | 3200 | 10 | ◎ |
| 24 | 20 | PEI | 0.5 | Q | 0.0009 | G | 0.06 | 0.0005 | 0.3 | 3800 | 10 | ◎ |
| 25 | 20 | PEI | 0.5 | Q | 0.0009 | G | 0.12 | 0.0005 | 0.3 | 5900 | 10 | ◎ |
| 26 | 20 | PEI | 0.5 | Q | 0.0009 | G | 0.2 | 0.0005 | 0.3 | 7000 | 10 | ◎ |
| 27 | 20 | PEI | 0.5 | Q | 0.0009 | G | 0.3 | 0.0005 | 0.3 | 8200 | 10 | ◎ |
| 28 | 20 | PEI | 0.5 | Q | 0.0009 | G | 0.09 | 0.0001 | 0.3 | 9400 | 10 | Δ |
| 29 | 20 | PEI | 0.5 | Q | 0.0009 | G | 0.09 | 0.0002 | 0.3 | 7800 | 10 | ○ |
| 30 | 20 | PEI | 0.5 | Q | 0.0009 | G | 0.09 | 0.0003 | 0.3 | 6500 | 10 | ◎ |
| 31 | 20 | PEI | 0.5 | Q | 0.0009 | G | 0.09 | 0.001 | 0.3 | 2700 | 10 | ◎ |
| 32 | 20 | PEI | 0.5 | Q | 0.0009 | G | 0.09 | 0.002 | 0.3 | 1500 | 10 | ◎ |
| 33 | 20 | PEI | 0.5 | Q | 0.0009 | G | 0.09 | 0.003 | 0.3 | 1000 | 10 | ◎ |
| 34 | 20 | PEI | 0.5 | Q | 0.0009 | G | 0.09 | 0.0005 | 0.02 | 1800 | 10 | ◎ |
| 35 | 20 | PEI | 0.5 | Q | 0.0009 | G | 0.09 | 0.0005 | 0.03 | 2300 | 10 | ◎ |
| 36 | 20 | PEI | 0.5 | Q | 0.0009 | G | 0.09 | 0.0005 | 0.1 | 3800 | 10 | ◎ |
| 37 | 20 | PEI | 0.5 | Q | 0.0009 | G | 0.09 | 0.0005 | 0.5 | 5000 | 10 | ◎ |
| 38 | 20 | PEI | 0.5 | Q | 0.0009 | G | 0.09 | 0.0005 | 1.0 | 4500 | 10 | ◎ |
| 39 | 20 | PEI | 0.5 | Q | 0.0009 | G | 0.09 | 0.0005 | 2.0 | 4200 | 10 | ◎ |
| 40 | 20 | PPI | 0.5 | Q | 0.0009 | G | 0.09 | 0.0005 | 0.3 | 5200 | 10 | ◎ |
| 41 | 20 | PBI | 0.5 | Q | 0.0009 | G | 0.09 | 0.0005 | 0.3 | 5000 | 10 | ◎ |
| 42 | 20 | PEI | 0.5 | Q | 0.0009 | αA | 0.09 | 0.0005 | 0.3 | 5000 | 10 | ◎ |
| 43 | 20 | PEI | 0.5 | Q | 0.0009 | H | 0.09 | 0.0005 | 0.3 | 4500 | 10 | ◎ |

Q: Quinaldic acid, G: Glycine: PEI: Polyethyleneimine (Average molecular weight: 70,000)
PPI: Polypropyleneimine (Average molecular weight: 50,000),
PEI: Polybutadieneimine (Average molecular weight: 50,000), αA: α-alanine, H: Histidine As evident from the results shown in Tables 1 and 2, it was confirmed that the stock removal rate of copper was good, little erosion was observed on the copper layer after the polishing, and the surface state was good, except for Examples 10, 16, 21 and 28. However, in Example 10 wherein the amount of the polyethyleneimine is so small as 0.03 g/l, significant erosion was formed on the copper layer. Further, in Example 16 wherein the amount of quinaldic acid was so small as 0.0002 mol/l, the copper layer surface was roughened, and in a case where the amount of quinaldic acid was 0.005 mol/l (Example 21), significant erosion was formed. Further, in Example 28 wherein the amount of benzotriazole was 0.0001 mol/l and was extremely small, the copper layer surface was eroded, and no good copper layer surface could be obtained.

It was found from Examples 1 to 9 that the stock removal rate of copper increased together with increase in the amount of the colloidal silica. There is fear that if the addition amount is 3 g/l, the stock removal rate was not adequate, and no efficient polishing may be carried out. Further, if the addition amount is too much, the stock removal rate tends to be extremely high, whereby it tends to be difficult to control the polishing, or as mentioned above, the rate of polishing the tantalum-containing compound layer tends to be too high, whereby the erosion is likely to form. By taking them into consideration, the amount of the colloidal silica is at a level of from 5 to 50 g/l, preferably from 10 to 30 g/l, more preferably from 15 to 25 g/l.

Small amount of the polyethyleneimine is preferred in view of the stock removal rate, but unfavorable in view of formation of erosion, as mentioned above. Further, if its amount is at least 3 g/l, the abrasive tends to aggregate, which may cause abrasion scratches. Taking them into consideration, the addition amount of the polyethyleneimine is preferably at a level of from 0.1 to 3 g/l. Further, if the addition amount of quinaldic acid increases, the stock removal rate of copper tends to decrease. When its amount is 0.005 mol/l, the stock removal rate was so low as 2,000 A/min. Further, if it is too small, the surface is roughened. Accordingly, it is preferably at a level of from 0.0006 to 0.0012 mol/l.

Addition of glycine has favorable effects against erosion and surface roughening. However, if it is at least 0.2 mol/l, the stock removal rate of copper is at least 7,000 A/min and is extremely high, and control of the polishing is considered to be difficult. The addition amount is at a level of from 0.04 to 0.2 mol/l, preferably from 0.06 to 0.12 mol/l.

As mentioned above, if the addition amount of benzotriazole is too small, the copper layer surface tends to be roughened due to erosion on the copper layer surface, and if it is at least 0.002 mol/l, the stock removal rate of copper extremely decreases. Accordingly, the amount is considered to be suitably at a level of from 0.0003 to 0.001 mol/l.

Hydrogen peroxide has favorable effects against erosion and surface roughening. However, the stock removal rate of copper decreases not only in a case where the amount is small but also it is too large. Accordingly, the addition amount is from 0.03 to 1.0 mol/l, preferably from 0.1 to 0.5 mol/l.

Substantially no difference is confirmed depending upon the type of the polyalkyleneimine with regard to the effect on the stock removal rate, erosion and surface roughening, under the testing conditions (addition amount was constant at 0.5 mol/l). Namely, substantially no difference among polyethyleneimine, polybutadieneimine and polypropyleneimine was confirmed, and substantially no difference was confirmed in a case where α-alanine and histidine were employed instead of glycine in Examples 42 and 43, respectively, and good results were obtained in each Example.

According to the present invention, in a CMP process of a semiconductor device having at least a copper layer and a tantalum-containing compound layer, formation of erosion can be suppressed as far as possible even at a region having a high copper wiring density (90%) by incorporating a polyalkyleneimine in a polishing composition. Further, by incorporating quinaldic acid, a normal polished surface can be obtained.

Namely, polishing can be carried out without increasing erosion at a high density copper wiring portion, by means of a polishing composition comprising the following components (a) an abrasive which is at least one member selected from the group consisting of silicon dioxide, aluminum oxide, cerium oxide, zirconium oxide and titanium oxide, (b) a polyalkyleneimine, (c) at least one member selected from the group consisting of quinaldic acid and its derivatives, (d) at least one member selected from the group consisting of glycine, α-alanine, histidine and their derivatives, (e) at least one member selected from the group consisting of benzotriazole and its derivatives, (f) hydrogen peroxide, and (g) water.

Further, a semiconductor device having at least a layer of copper and a layer of a tantalum-containing compound formed on a substrate, can be polished in such a manner that the tantalum-containing compound efficiently acts as a stopper at a high density wiring portion having a copper wiring density of at least 90%, and formation of erosion at a high density copper wiring portion can be suppressed as far as possible, by a polishing method by means of a polishing composition comprising (a) an abrasion which is at least one member selected from the group consisting of silicon dioxide, aluminum oxide, cerium oxide, zirconium oxide and titanium oxide, (b) a polyalkyleneimine, (c) at least one member selected from the group consisting of quinaldic acid and its derivatives, (d) at least one member selected from the group consisting of glycine, α-alanine, histidine and their derivatives, (e) at least one member selected from the group consisting of benzotriazole and its derivatives, (f) hydrogen peroxide and (g) water.

The entire disclosure of Japanese Patent Application No. 2000-357249 filed on Nov. 24, 2000 including specification, claims and summary are incorporated herein by reference in its entirety.

What is claimed is:

1. A polishing composition comprising the following components (a) to (g):
   (a) an abrasive which is at least one member selected from the group consisting of silicon dioxide, aluminum oxide, cerium oxide, zirconium oxide and titanium oxide,
   (b) a polyalkyleneimine,
   (c) at least one member selected from the group consisting of quinaldic acid and its derivatives,
   (d) at least one member selected from the group consisting of glycine, α-alanine, histidine and their derivatives,
   (e) at least one member selected from the group consisting of benzotriazole and its derivatives,
   (f) hydrogen peroxide, and
   (g) water.

2. The polishing composition according to claim 1, wherein the polyalkyleneimine as the component (b) is polyethyleneimine, the component (c) is quinaldic acid, the component (d) is glycine, and the component (e) is benzotriazole.

3. A polishing method for polishing a semiconductor device having at least a layer of copper and a layer of a tantalum-containing compound formed on a substrate, by means of the polishing composition as defined in claim 1.

4. A polishing method for polishing a semiconductor device having at least a layer of copper and a layer of a tantalum-containing compound formed on a substrate, by means of the polishing composition as defined in claim 2.

5. The polishing composition of claim 1, wherein the polyalkylenemine is of from 0.5 to 3 g/l based on the polishing composition.

6. The polishing composition of claim 1, wherein the polyalkyleneamine is of from 0.1 to 1 g/l based on the polishing composition.

7. The polishing composition of claim 1, wherein the quinaldic acid is of from 0.0003 to 0.005 g/l based on the polishing composition.

8. The polishing composition of claim 1, wherein the quinaldic acid is of from 0.0006 to 0.0012 g/l based on the polishing composition.

9. The polishing composition of claim 1, wherein the component (d) is of from 0.04 to 0.2 g/l based on the polishing composition.

10. The polishing composition of claim 1, wherein the component (d) is of from 0.06 to 0.12 g/l based on the polishing composition.

11. The polishing composition of claim 1, wherein the abrasive is of from 5 to 50 g/l based on the polishing composition.

12. The polishing composition of claim 1, wherein the abrasive is of from 15 to 25 g/l based on the polishing composition.

13. The polishing composition of claim 1, wherein the benzotriazole is of from 0.0002 to 0.002 g/l based on the polishing composition.

14. The polishing composition of claim 1, wherein the benzotriazole is of from 0.0003 to 0.001 g/l based on the polishing composition.

15. The polishing composition of claim 1, wherein the hydrogen peroxide is of from 0.03 to 1 g/l based on the polishing composition.

16. The polishing composition of claim 1, wherein the hydrogen peroxide is of from 0.1 to 0.5 g/l based on the polishing composition.

17. The polishing composition of claim 1, wherein the pH is adjusted to pH 3 to 10.

* * * * *